United States Patent
Huang et al.

(10) Patent No.: US 8,659,160 B2
(45) Date of Patent: Feb. 25, 2014

(54) DIE STRUCTURE, MANUFACTURING METHOD AND SUBSTRATE THEREOF

(75) Inventors: Meng-Chi Huang, Kaohsiung (TW);
Han-Ping Yang, Hsinchu (TW);
Min-Chieh Chou, Taipei (TW);
Tune-Hune Kao, Hsinchu (TW);
Jung-Kang Peng, Hsinchu County (TW); Cheng-Hsuan Lin, Taoyuan County (TW); Jian-Shian Lin, Yilan County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 429 days.

(21) Appl. No.: 13/186,411

(22) Filed: Jul. 19, 2011

(65) Prior Publication Data
US 2012/0168950 A1    Jul. 5, 2012

(30) Foreign Application Priority Data

Dec. 31, 2010   (TW) .............................. 99147379 A

(51) Int. Cl.
*H01L 23/48* (2006.01)
(52) U.S. Cl.
USPC .................. 257/762; 438/113; 257/E21.499; 257/712
(58) Field of Classification Search
USPC ................. 257/712, 762, E21.499, E23.01; 438/113
See application file for complete search history.

(56) References Cited

U.S. PATENT DOCUMENTS

| 5,229,549 A | 7/1993 | Yamakawa et al. |
| 5,747,877 A | 5/1998 | Wilson |
| 6,278,192 B1 * | 8/2001 | Takigawa et al. ............. 257/787 |
| 6,531,328 B1 | 3/2003 | Chen |
| 6,562,643 B2 | 5/2003 | Chen |
| 7,025,651 B2 | 4/2006 | Song et al. |

(Continued)

FOREIGN PATENT DOCUMENTS

| CN | 101740671 A | 6/2010 |
| CN | 101752328 A | 6/2010 |

(Continued)

OTHER PUBLICATIONS

Huang et al., A Study on Copper Pillar Interconnect in Flip-Chip-On-Module Packageing, Electronics Packaging Technology Conference, 2007, EPTC 2007, 9th, pp. 325-330, IEEE.

(Continued)

*Primary Examiner* — Roy Potter
(74) *Attorney, Agent, or Firm* — Morris Manning & Martin LLP; Tim Tingkang Xia, Esq.

(57) ABSTRACT

A die structure, a manufacturing method and a substrate, wherein the die structure is constituted by a chip on wafer (COW) and the substrate, and the substrate is formed by stacking and then cutting a plurality of thermal and electrical conductive poles and a plurality of insulating material layers. Moreover, the fabricating of the die structure comprises a plurality of COWs carried on a carrier board is bonded on the substrate, the plurality of COWs are in contact with the plurality of thermal and electrical conductive poles on the substrate, and then the carrier board is removed. After that, a phosphor plate is adhered on the plurality of COWs so as to form a stacked structure. Thereafter, the stacked structure is cut, thus forming a plurality of die structures having at least one COW.

17 Claims, 12 Drawing Sheets

(56) References Cited

U.S. PATENT DOCUMENTS

| | | | |
|---|---|---|---|
| 7,176,502 | B2 | 2/2007 | Mazzochette et al. |
| 7,456,496 | B2 * | 11/2008 | Hwee et al. .................. 257/691 |
| 7,667,384 | B2 | 2/2010 | Chen et al. |
| 2004/0045656 | A1 | 3/2004 | Horng et al. |
| 2004/0188696 | A1 | 9/2004 | Hsing Chen et al. |
| 2004/0248377 | A1 | 12/2004 | Yoo et al. |
| 2005/0161682 | A1 | 7/2005 | Mazzochette et al. |
| 2007/0042520 | A1 | 2/2007 | Oh et al. |
| 2008/0179618 | A1 | 7/2008 | Cheng |
| 2010/0059785 | A1 | 3/2010 | Lin et al. |

FOREIGN PATENT DOCUMENTS

| | | |
|---|---|---|
| TW | M271254 | 7/2005 |
| TW | M328763 | 3/2008 |
| TW | M354860 | 4/2009 |
| TW | M357842 | 5/2009 |
| TW | M359191 | 6/2009 |
| TW | M364272 | 9/2009 |
| TW | M373097 | 1/2010 |

OTHER PUBLICATIONS

Zhu et al., Aligned Carbon Nanotubes for Electrical Interconnect and Thermal Management, Electronic Components and Technology Conference, 2005, Proceedings. 55th, vol. 1, pp. 44-50, IEEE.

Li et al., Design and Management of 3D Chip Multiprocessors Using Network-in-Memory, ISCA'06 Proceedings of the 33rd International Symposium on Computer Architecture, 2006, pp. 130-141, IEEE Computer Society Washintong, DC, USA.

State Intellectual Property Office of the People's Republic of China, "Office Action", China, Sep. 12, 2013.

* cited by examiner

DIE STRUCTURE, MANUFACTURING METHOD AND SUBSTRATE THEREOF

CROSS-REFERENCE TO RELATED APPLICATIONS

This non-provisional application claims priority under 35 U.S.C. §119(a) on Patent Application No(s). 099147379 filed in Taiwan, R.O.C. on Dec. 31, 2010, the entire contents of which are hereby incorporated by reference.

BACKGROUND

1. Field

The present disclosure relates to a die structure, a manufacturing method and a substrate thereof.

2. Related Art

In recent years, LEDs having such advantages as power saving, environmental friendly, quick response and controllable light emission spectrum have gradually replaced the conventional light sources. The performance of LED has been continuously improved to satisfy the requirement for general lighting; however, in high power LEDs (e.g. greater than 1 W), the heat dissipation becomes critical issue due to its rapidly generating of heat during operation. The main reasons lie in that, only 15% to 20% of electrical energy can be converted into the light energy, and the rest of energy will be consumed and dissipated in heat form. Thus, if the heat cannot be dissipated to atmosphere in time, temperature of the LED chip (or die) disposed on the substrate will rise up to extremely high and consequently the conversion efficiency and life time of LED will be rapidly decreased.

At present, one of the approaches to improve heat dissipation capability of LED package has been focused on the material of the substrate. For example, metal core printed circuit board (MCPCB) is formed by hot-pressing of an aluminum alloy heat dissipation layer, an insulating adhesive layer and a metal circuit layer (copper foil). Due to its high thermal conductivity of aluminum alloy, the heat dissipation can be enhanced. Although the thermal conductivity of the MCPCB may achieve 1 W/mK to 2.2 W/mK, which can satisfy the requirement of a part of high power LEDs, the heat dissipation capability have been limited by thermal conductivity of the insulating adhesive. Moreover, since the coefficient of thermal expansion (CTE) of the MCPCB and that of the LED chip (or die) are mismatched, the LED chip is easily influenced by the temperature changes; as a result, the reliability and life time of LED package will be rapidly reduced because of peeling, cracking or failing on LED chip.

Compared with the metals, the ceramic materials have the CTE relatively closed to that of the LED chip; therefore, in current development of the high power LED, ceramics are commonly used to be the substrate material. In general, ceramic raw materials include clay minerals, such as aluminum oxide, aluminum nitride, silicon carbide, tungsten carbide, and other oxide, non-oxide and composite materials, and its shape can be formed by casting, molding, pressing, or other approaches. In LED applications, conductive pillars are required in ceramic substrate for heat dissipation and power transmission. By filling conductive slurry after mechanical drilling on solidified ceramic substrate, or by stacking and solidifying a plurality of ceramic raw material layers with horizontal-aligned slurry-filled through hole, conductive pillar can be obtained in the substrate as the heat and electricity pathway to improve electrical and thermal conductivity of ceramic substrate.

In conventional ceramic substrate, to enable the ceramic substrate to have a lower CTE and a higher electrical or thermal conductivity, the method includes disposing a plurality of through holes on the ceramic substrate by mechanical or laser drilling process and filling metal slurry into the through holes to form electrical or thermal pathway in the ceramic substrate. However, this method of disposing the electrical or thermal pathway requires machine tools to serially drill the substrate, and the minimum pitch of through holes is limited by the process and tools (typically 0.4 mm). The mechanical drilling consumes longer manufacturing time to form vias on higher density of through holes or on higher hardness ceramics.

In addition, to let the metal slurry smoothly filled into the holes without void defects, the diameter of through hole should be large enough; consequently, the contact area between LED chip and the filled holes, as well as through hole density will be limited in previous approaches. Due that the pathway cannot be distributed in a high density (larger than 0.4 mm-pitch), LED die or chip needs to be aligned before bonding to the substrate to ensure the LED die or chip locating at proper position and contacting with the pathway. Besides increasing the complexity of fabrication process, the throughput of total LED packaging is decreased.

SUMMARY

The present disclosure provides a die structure, a manufacturing method and a substrate thereof.

The present disclosure discloses a die structure manufacturing method. The die structure manufacturing method comprises providing a carrier board where a plurality of chip on wafer (COWs) are disposed; providing a substrate, in which the substrate has a plurality of thermal and electrical conductive poles and the plurality of thermal and electrical conductive poles are exposed out of two opposite side surfaces of the substrate; bonding the plurality of COWs on one of the side surfaces of the substrate to make the plurality of thermal and electrical conductive poles in contact with the plurality of COWs; removing the carrier board; adhering a phosphor plate on the plurality of COWs so as to form a stacked structure; and cutting the stacked structure to form a plurality of die structures.

The present disclosure discloses a die structure. The die structure comprises a substrate, in which the substrate has a plurality of thermal and electrical conductive poles and two ends of each of the plurality of thermal and electrical conductive poles are exposed out of two opposite side surfaces of the substrate; an COW disposed on one of the side surfaces of the substrate and in contact with the plurality of thermal and electrical conductive poles; and a phosphor plate disposed on one side surface of the COW opposite to the substrate.

The present disclosure also discloses a substrate applied in a die structure. The substrate comprises a body and a plurality of thermal and electrical conductive poles. The body comprises a plurality of first insulating material layers stacked along a stacking direction. The diameter of each of the plurality of the thermal and electrical conductive poles is between 10 μm and 500 μm. The plurality of thermal and electrical conductive poles is arranged at an interval of 0.02 mm to 1.0 mm between every two adjacent first insulating material layers. An axis of the plurality of thermal and electrical conductive poles is substantially perpendicular to the stacking direction, in which two ends of the plurality of thermal and electrical conductive poles are exposed out of two opposite surfaces of the body.

The manufacturing method of the substrate comprises: providing a plurality of first insulating material layers and a plurality of thermal and electrical conductive poles; alternately stacking the plurality of first insulating material layers and the plurality of thermal and electrical conductive poles along a stacking direction so as to form a sandwich structure, in which the plurality of thermal and electrical conductive poles is arranged at an interval between two adjacent first insulating material layers and an axis of the plurality of thermal and electrical conductive poles is substantially perpendicular to the stacking direction (or stacking axis); sintering the sandwich structure; and cutting the sandwich structure along an radial direction of the plurality of thermal and electrical conductive poles to form a plurality of substrates.

BRIEF DESCRIPTION OF THE DRAWINGS

The present disclosure will become more fully understood from the detailed description given herein below for illustration only, and thus are not limitation of the present disclosure, and wherein.

DETAILED DESCRIPTION

Figure 1:
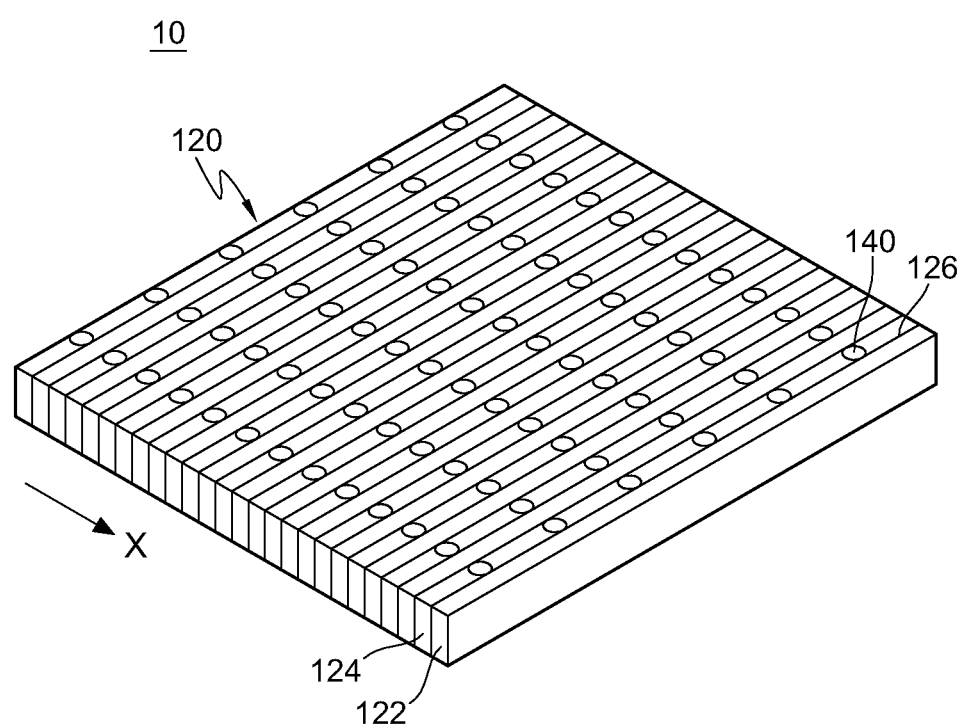
FIG. 1 is a schematic three-dimensional view of a first embodiment of the present disclosure.
Figure 2:
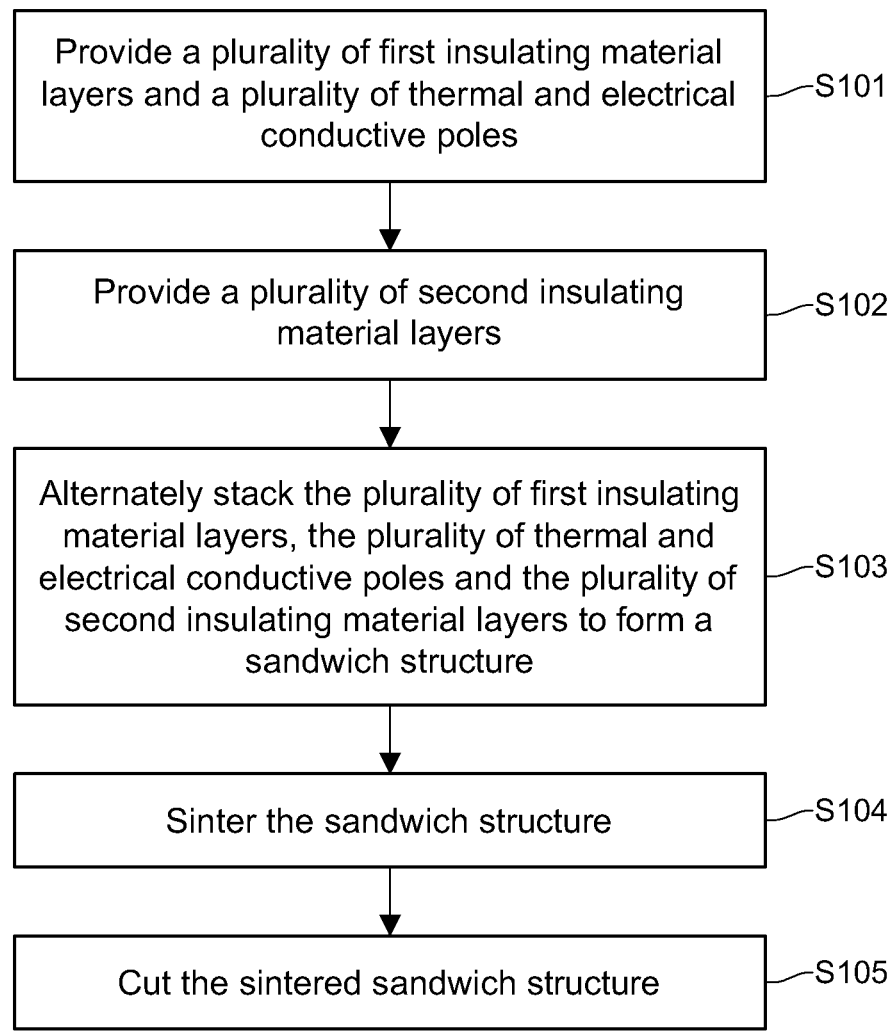
FIG. 2 is a schematic flow chart of the first embodiment of the present disclosure.

Referring to FIG. 1, a substrate (or called as substrate structure) 10 according to a first embodiment of the present disclosure comprises a body 120 and a plurality of thermal and electrical conductive poles 140. The body 120 has a plurality of first insulating material layers 122 and a plurality of second insulating material layers 124. The first insulating material layers 122 and the second insulating material layers 124 are formed by a material having a low coefficient of thermal expansion (smaller than about 10 ppm/° C.), which may be, but not limited to, one selected from a group consisting of ceramic (such as aluminum oxide ceramic and aluminum nitride ceramic), diamond-like carbon, diamond, monocrystalline silicon, polycrystalline silicon, glass and any combination thereof. In this embodiment, the material of the first insulating material layers 122 and the second insulating material layers 124 is illustrated by taking a low-temperature co-fired ceramic (LTCC) having a sintering temperature lower than 1000° C. as an example, but the present disclosure is not limited thereto.

The plurality of first insulating material layers 122 and the plurality of second insulating material layers 124 are alternately stacked (or called interlaced) along a stacking direction x, so that the plurality of first insulating material layers 122 and the plurality of second insulating material layers 124 are connected in a staggered arrangement, and sintered interfaces 126 are formed between adjacent the first insulating material layer 122 and the second insulating material layer 124. The sintered interfaces 126 are a bonded interface formed by the phase change of the first insulating material layer 122 and the second insulating material layer 124 during the sintering process. Or, if the first insulating material layers 122 and the second insulating material layers 124 are made of the same material, when the melting temperature is reached during the sintering process, the first insulating material layers 122 and the second insulating material layers 124 are melted into one body, thereby forming a stable bonded structure between the first insulating material layers 122 and the second insulating material layers 124.

The plurality of thermal and electrical conductive poles 140 are disposed in each second insulating material layer 124 and the thickness of the second insulating material layer 124 and the thickness of the first insulating material layer 122 are greater than or equal to the diameter of the thermal and electrical conductive pole 140. The diameter of the thermal and electrical conductive pole 140 may be, but not limited to, between 10 μm and 500 μm. The plurality of thermal and electrical conductive poles 140 are formed by a non-metal or metal material having a good thermal conductivity and electrical conductivity, which may be, but not limited to, graphite or one selected from a group consisting of copper, silver, gold, aluminum and any alloy thereof.

The plurality of thermal and electrical conductive poles 140 are arranged at an interval of smaller than 1.0 mm, e.g. 0.02 mm to 1.0 mm in the second insulating material layers 124. An axis (or called as major axis or direction of the axis) of the plurality of thermal and electrical conductive poles 140 is substantially perpendicular to the stacking direction x. Two opposite ends of each of thermal and electrical conductive poles 140 penetrate the second insulating material layers 124 and are exposed out of two opposite side surfaces of the body 120 and at the same level as the surfaces of the body 120.

Referring to FIG. 1 to FIG. 3C, in the manufacturing method of the substrate 10 according to the first embodiment of the present disclosure comprises multiple steps. Firstly, a plurality of first insulating material layers 122 and a plurality of thermal and electrical conductive poles 140 are provided (S101) and a plurality of second insulating material layers are provided (S102). The material of any of the first insulating material layers 122 and the second insulating material layers 124 may be one selected from a group consisting of ceramic, diamond-like carbon, diamond, mono-crystalline silicon, polycrystalline silicon, glass and any combination thereof. The thermal and electrical conductive pole 140 may be a wire material or columnar object formed by a non-metal or metal material having a higher thermal conduction and electrical conductivity, which may be, but not limited to, a pure solid graphite bar made of graphite only; or a pure solid metal column made of a metal material selected from among copper, silver, gold, aluminum and any alloy thereof without any dopants (such as the heat dissipation grease or electrical conductive adhesive). In this embodiment, the first insulating material layer 122 is illustrated by taking low-temperature co-fired ceramic (LTCC) as an example, the second insulating material layers 124 is illustrated by taking a low-temperature co-fired ceramic (LTCC) slurry as an example and the thermal and electrical conductive pole 140 is illustrated by taking a solid copper metal column as an example, but the present disclosure is not limited thereto.

Figure 3A:
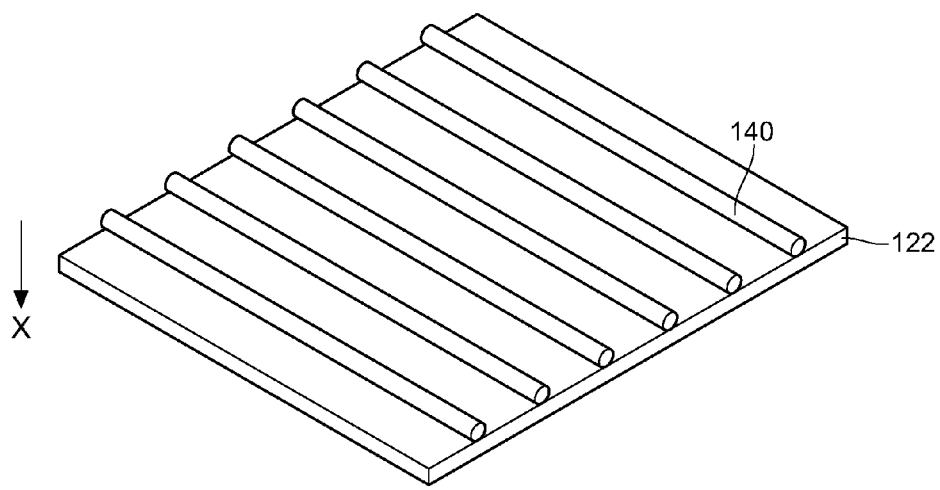
FIG. 3A is a schematic three-dimensional view of thermal and electrical conductive poles stacked on a first insulating material layer according to the first embodiment of the present disclosure.

Then, the plurality of first insulating material layers 122, the plurality of thermal and electrical conductive poles 140 and the plurality of second insulating material layers 124 are alternately stacked (interlaced) along a stacking direction x. Firstly, a part of the plurality of thermal and electrical conductive poles 140 is disposed on one of the first insulating material layers 122, and is arranged at an interval of smaller than 1.0 mm on a surface of the first insulating material layer 122 (as shown in FIG. 3A). The stacking direction x is the direction along which the plurality of thermal and electrical conductive poles 140 are placed on the first insulating material layers 122. The plurality of thermal and electrical conductive poles 140 may be, but not limited to being, arranged at an interval in parallel to each other. Accordingly, the axis of the plurality of thermal and electrical conductive poles 140 is substantially perpendicular to the stacking direction x. Furthermore, the plurality of thermal and electrical conductive poles 140 can be arranged at an equal interval or unequal intervals on the surface of the first insulating material layers 122.

Figure 3B:
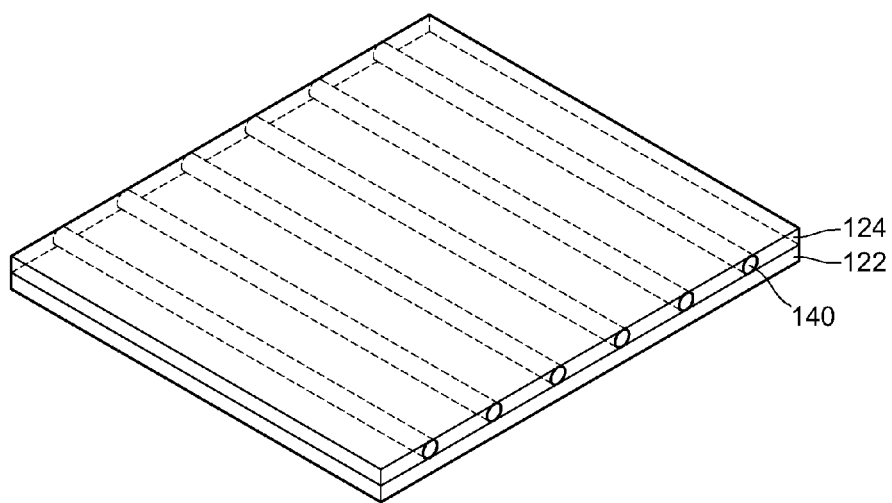
FIG. 3B is a schematic three-dimensional view of a first insulating material layer, thermal and electrical conductive poles and a second insulating material layer alternately stacked according to the first embodiment of the present disclosure.

After that, one of the second insulating material layers 124 is stacked along the stacking direction x on the surface of the first insulating material layer 122. The second insulating material layers 124 wrap (or embrace) the plurality of thermal and electrical conductive poles 140 (as shown in FIG. 3B). Then, according to the stacking sequence of the first insulating material layer 122, the thermal and electrical conductive poles 140 and the second insulating material layer 124, the rest first insulating material layers 122, thermal and electrical conductive poles 140 and second insulating material layers 124 are alternately stacked (interlaced) along the stacking direction x. The plurality of thermal and electrical conductive poles 140 are arranged at an interval in each second insulating material layer 124. Therefore, the plurality of first insulating material layers 122, the plurality of thermal and electrical conductive poles 140 and the plurality of second insulating material layers 124 are stacked in a staggered manner to form a sandwich structure 20 (S103).

Figure 3C:
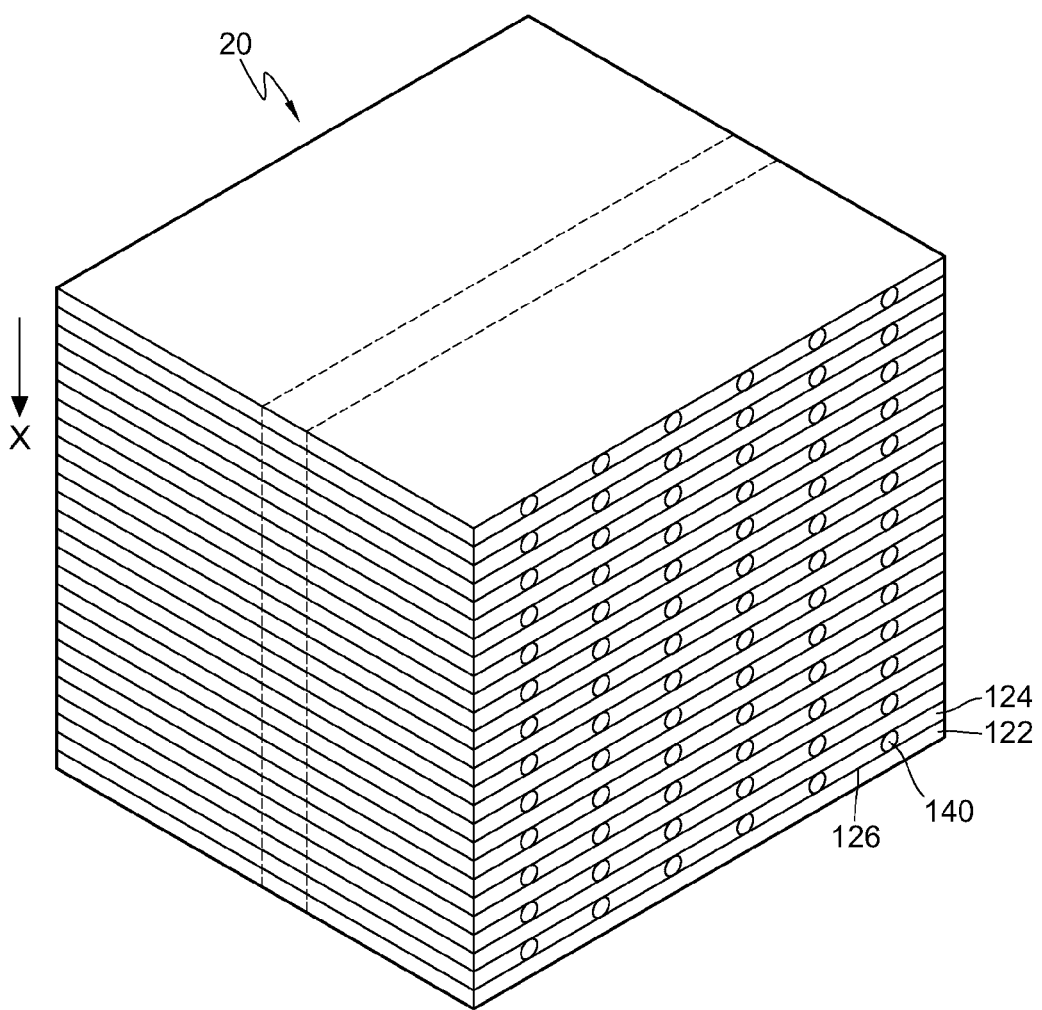
FIG. 3C is a schematic three-dimensional view of a stacked structure according to the first embodiment of the present disclosure.
Figure 4:
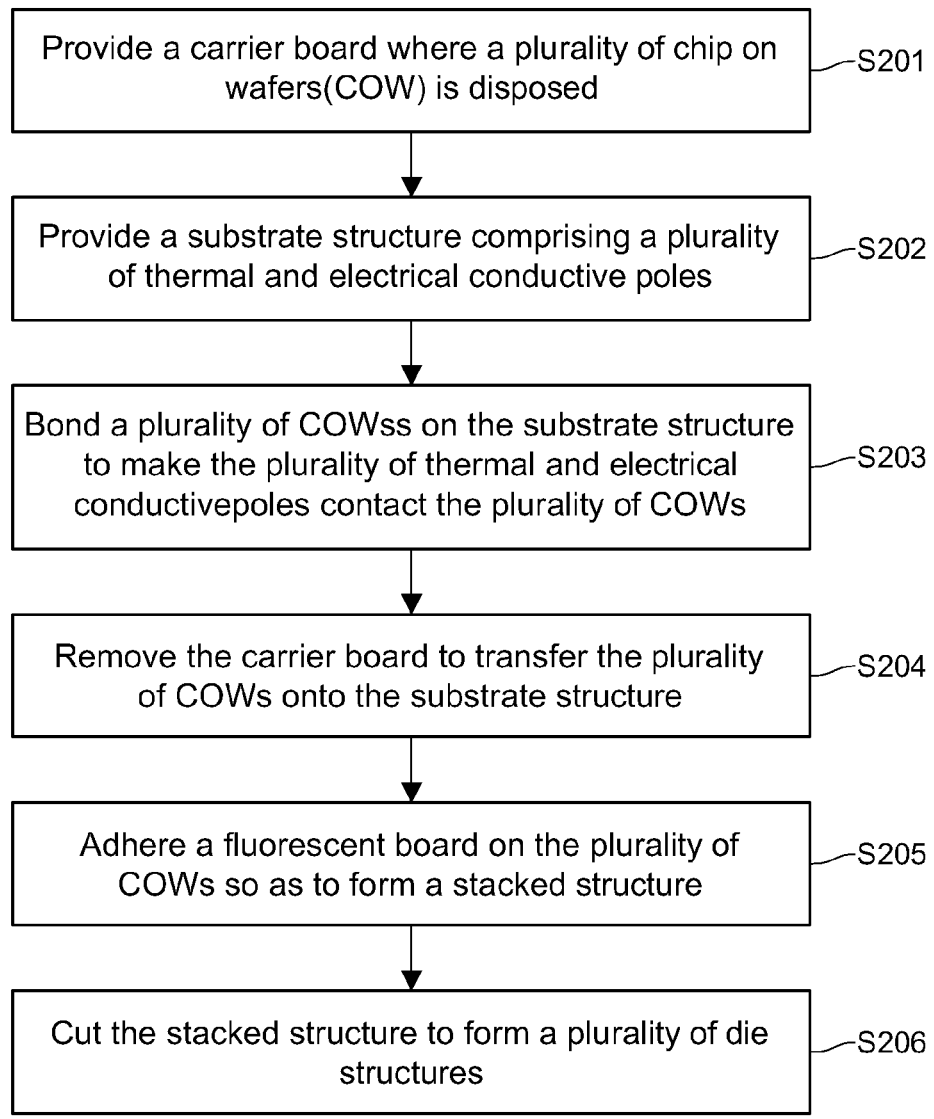
FIG. 4 is a schematic flow chart of manufacturing method according to an embodiment of the present disclosure.
Figure 5A:
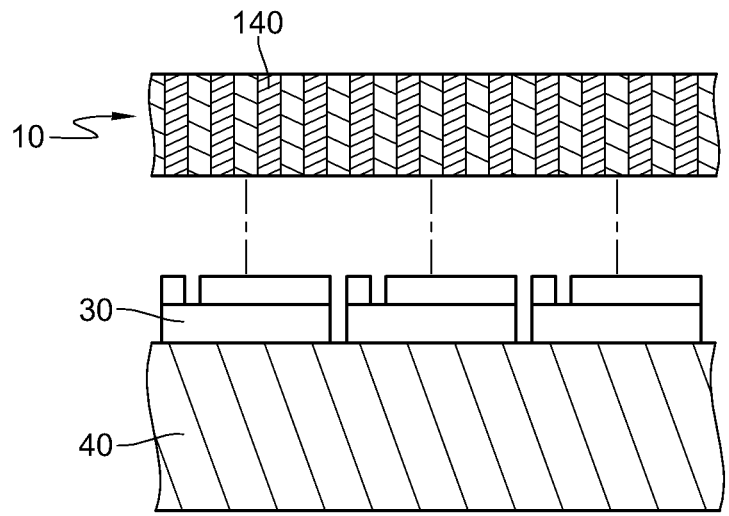
FIG. 5A to FIG. 5E are schematic structural views of fabricating processes according to an embodiment of the present disclosure.
Figure 5B:
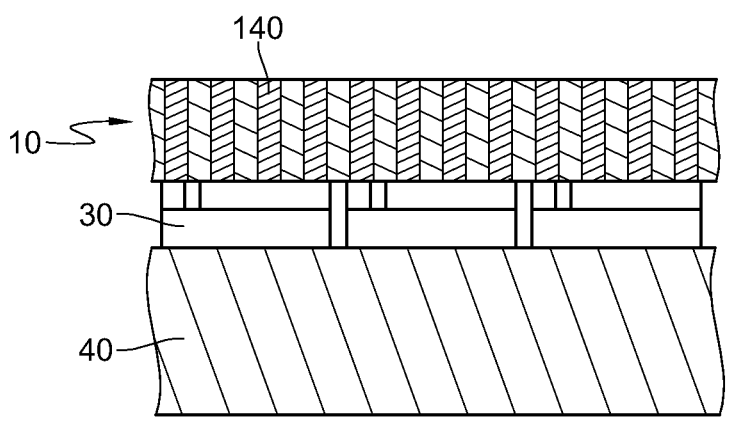
Figure 5C:
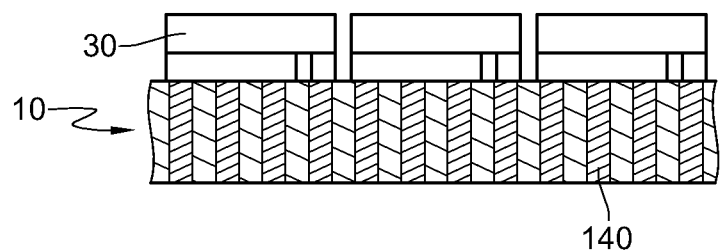
Figure 5D:
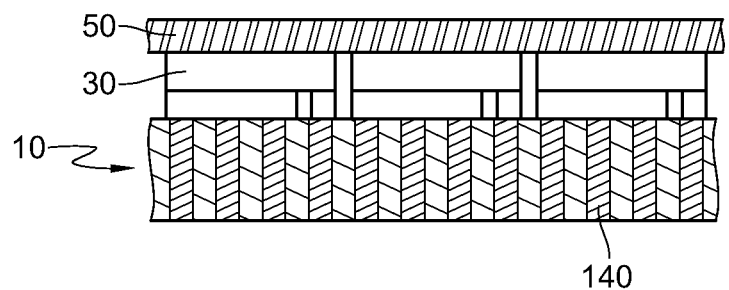
Figure 5E:
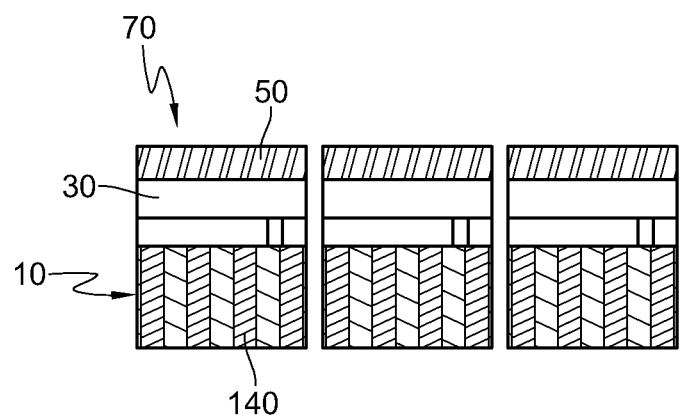

Thereafter, the sandwich structure 20 is sintered at a temperature lower than 1000° C. (S104), in which the sintering temperature may be adjusted according to the material of the first insulating material layers 122 and the material of the second insulating material layers 124. When the first insulating material layers 122 and the second insulating material layers 124 was heated to reach the sintering temperature, the interfaces between the first insulating material layers 122 and the second insulating material layers 124 are bonded through phase change. Consequently, sintered interfaces 126 between a first insulating material layer 122 and a second insulating material layer 124 are formed. The sintered interfaces 126 improve the bonding strength between the first insulating material layers 122 and the second insulating material layers 124. Therefore, after the sintering step, the plurality of first insulating material layers 122, the plurality of thermal and electrical conductive poles 140 and the plurality of second insulating material layers 124 in the sandwich structure 20 are joined into one body (as shown in FIG. 3C).

Finally, the sintered sandwich structure 20 is cut (S105) by an equipment such as a cutting blade, a waterjet (water cutting apparatus) or a laser along the radial direction of the plurality of thermal and electrical conductive poles 140, so as to obtain the substrate 10 as shown in FIG. 1. The plurality of first insulating material layers 122 and the plurality of second insulating material layers 124 are bonded in a staggered manner along the stacking direction x to form the body 120 of the substrate 10. The plurality of thermal and electrical conductive poles 140 are arranged at an interval in the second insulating material layers 124, and two opposite ends of each thermal and electrical conductive pole 140 are at the same level as the two opposite side surfaces of the body 120. In this manner, the plurality of thermal and electrical conductive poles 140 in the substrate 10 has the characteristics of electrical conduction in the perpendicular direction (that is, the axis of each of the thermal and electrical conductive poles 140) and non-electrical conduction in the lateral direction (that is, the radial direction of the thermal and electrical conductive poles 140).

Therefore, according to the above-mentioned manufacturing method, by alternately stacking the plurality of first insulating material layers, the plurality of thermal and electrical conductive poles and the plurality of second insulating material layers, and sintering and cutting the formed stacked structure, the substrate having a plurality of thermal and electrical conductive poles arranged in arrays is obtained. Since there in no need to use additional drilling and slurry filling procedures to form the substrate 10, the manufacturing method according to the present disclosure may be effectively simplified. In addition, since the thermal and electrical conductive poles are solid wire or solid column, and are pre-embedded in the stacked structure, person skilled in the art may use the thermal and electrical conductive poles with different diameters according to the requirement and adjust the distance between two adjacent thermal and electrical conductive poles to increase the number of the thermal and electrical conductive poles disposed in the substrate. Accordingly, the density of the plurality of thermal and electrical conductive poles distributed in the substrate can be increased. Dense thermal conductive and electrical conductive contacts on the substrate surface are increased as well. The thermal conductive and electrical conductive performance of the substrate is improved. This feature will keep better electrical conductivity in comparison with the traditional conductive structure where the electrical conductive slurry filled in substrate.

The substrate according to the present disclosure may be applied in an LED to serve as a submount of an LED die or a heat dissipation substrate of an LED chip, or applied in electronic devices such as a central processing unit (CPU) for carrying electronic elements that produce high heat during operation, e.g. a micro-processing chip. In the following explanation of embodiments of the present disclosure, the substrate is for example applied in an LED package, which is not intended to limit the present disclosure.

FIG. 4 and FIG. 5A to FIG. 5E illustrate manufacturing method of a die structure according to an embodiment of the present disclosure. Firstly, a carrier board 40 with a plurality of chip on wafer (COW) 30 is provided (S201), e.g. a plurality of LED COWs are disposed on the carrier board 40 like a substrate of sapphire, silicon carbide or gallium nitride. The substrate having a plurality of thermal and electrical conductive poles according to the first embodiment is provided (S202). Then, a plurality of COWs 30 are bonded on one side surface of the substrate 10 by silver paste, solder bump reflow or eutectic bonding. In consequence, the plurality of COWs 30 and the plurality of thermal and electrical conductive poles 140 are in physical contact (S203). In this process, a considerable number of thermal and electrical conductive poles 140 are distributed on the substrate 10. The plurality of thermal and electrical conductive poles 140 forms the thermal conductive and electrical conductive contacts with a high density on two opposite side surfaces of the substrate 10. As mentioned above, density of the thermal conductive and electrical conductive contacts of the substrate 10 can be high and the diameter of the thermal conductive and electrical conductive poles can be small. Therefore, when the substrate 10 and the plurality of COWs 30 are bonded, the electrical contacts of each COW 30 are properly electrically connected with the plurality of the thermal conductive and electrical conductive pole, respectively. Compared to traditional substrate, there is no need for the present manufacturing method to align the poles with the electrical contacts of each COW 30.

Thereafter, the carrier board 40 is removed (S204) so that the plurality of COWs 30 are separated from the carrier board 40. Then, a phosphor plate 50 is adhered on one side surface of the plurality of COWs 30 opposite to the substrate 10 so as to form a stacked structure 60 (S205). Then, the stacked structure 60 is cut to separate two adjacent COWs 30 to obtain a plurality of die structures 70 (S206). Each die structure 70 has at least one COW 30 on which the phosphor plate is adhered.

Figure 6A:
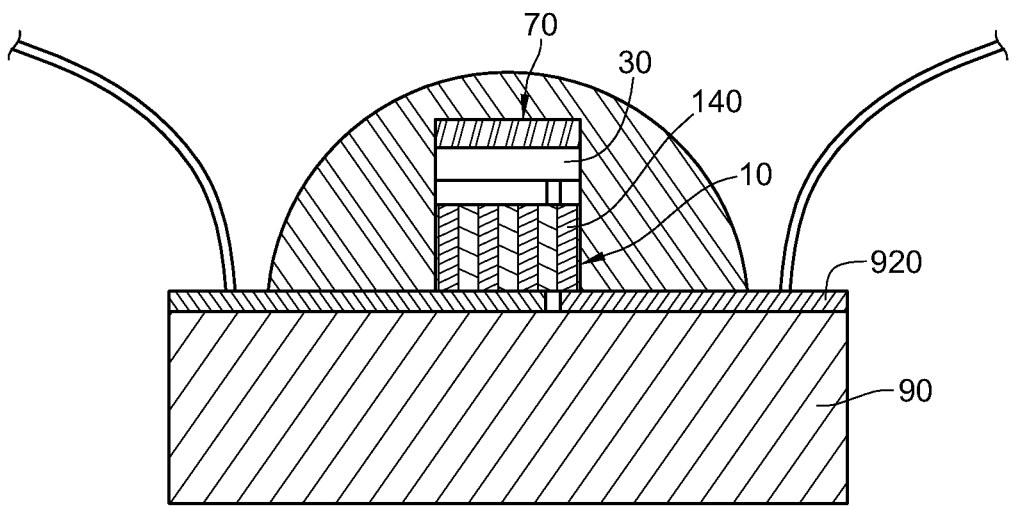
FIG. 6A and FIG. 6B are schematic views of an application of die structure according to an embodiment of the present disclosure.
Figure 6B:
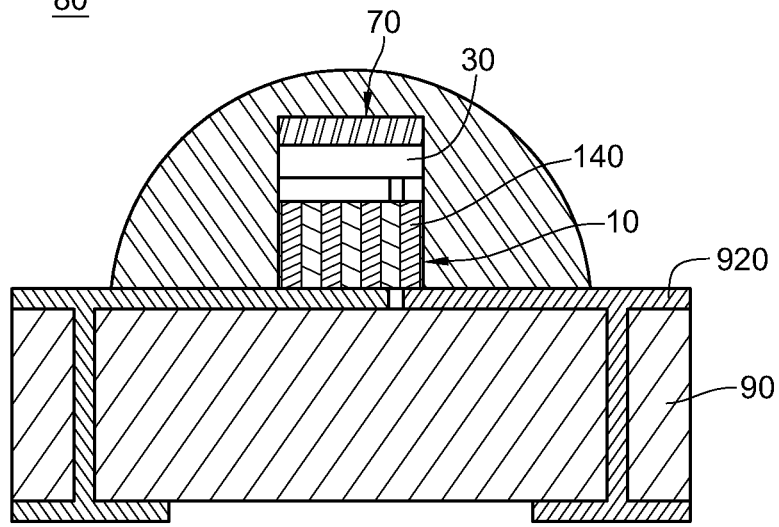

Referring to FIG. 6A and FIG. 6B. The die structure according to an embodiment of the present disclosure may be applied in different forms of LED packages 80. One side of a substrate 10 opposite to an COW 30 may be bonded to a surface of another substrate 90, such as a circuit board, a ceramic substrate or the substrate 10 of the present disclosure, so that the die structure 70 is in contact with a surface circuit 920 on the substrate 90 through a plurality of thermal and electrical conductive poles 140 of the substrate 10. Accordingly, the COW 30 may be electrically connected to the surface circuit 920 through the plurality of thermal and electrical conductive poles 140. In addition, the plurality of thermal and electrical conductive poles 140 may serve as a thermal conduction medium, so as to conduct the thermal energy generated by the COW 30 during operation onto the substrate 90, thereby achieving the efficacy of reducing the temperature of the die structure 70.

Based on the above structure, when an external power source is applied to the die structure 70, the external power source may be delivered to the COW 30 through the surface circuit 920 of the substrate 90 and the plurality of thermal and electrical conductive poles 140, thereby making the COW 30 be in operation. Additionally, the thermal energy generated by the COW 30 during operation may likewise be dissipated to the substrate 90 through the plurality of thermal and electrical conductive poles 140, thereby preventing the COW 30 from burn-out due to the excessively high temperature. Further, since the diameter of the plurality of thermal and electrical conductive poles 140 is smaller than 500 nm, the contact area between each thermal and electrical conductive pole 140 and the COW 30 can be effectively reduced, thereby reducing the stress between the thermal and electrical conductive pole 140 and the COW 30, and preventing the breaking caused by the excessively large stress between the COW 30 and the thermal and electrical conductive pole 140.

Figure 7:
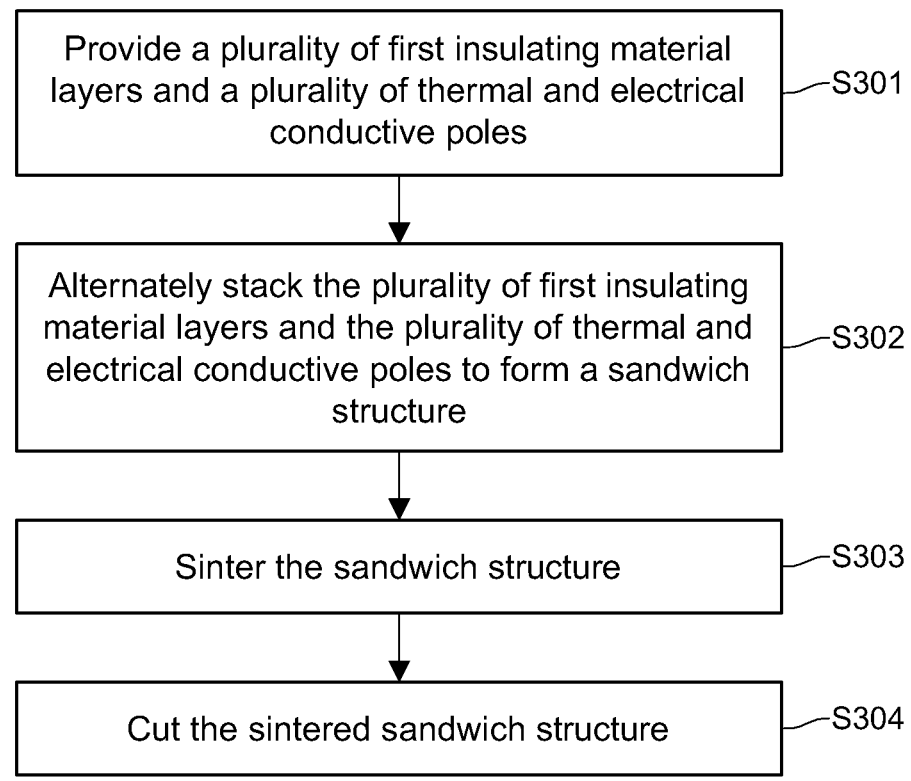
FIG. 7 is a schematic flow chart of manufacturing method fabricating according to a second embodiment of the present disclosure.
Figure 8A:
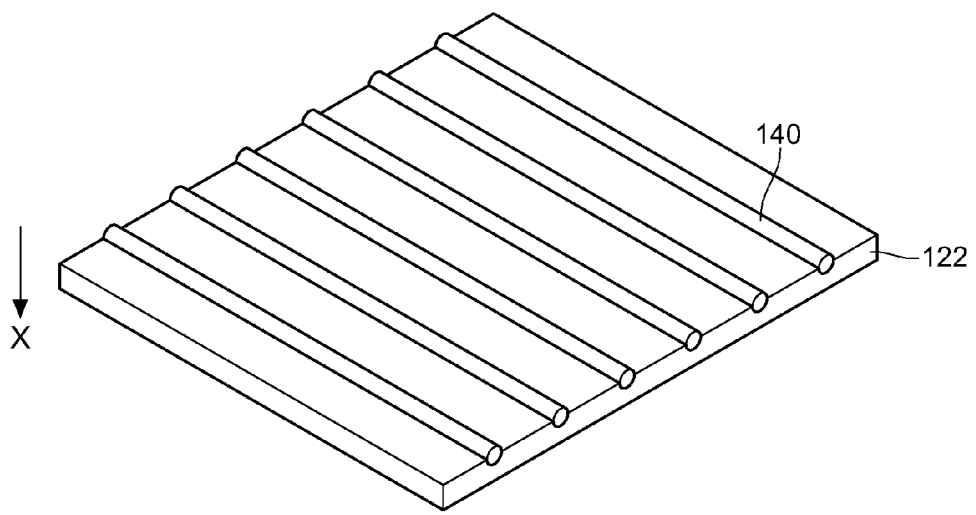
FIG. 8A is a schematic three-dimensional view of thermal and electrical conductive poles stacked on a first insulating material layer according to the second embodiment of the present disclosure.
Figure 8B:
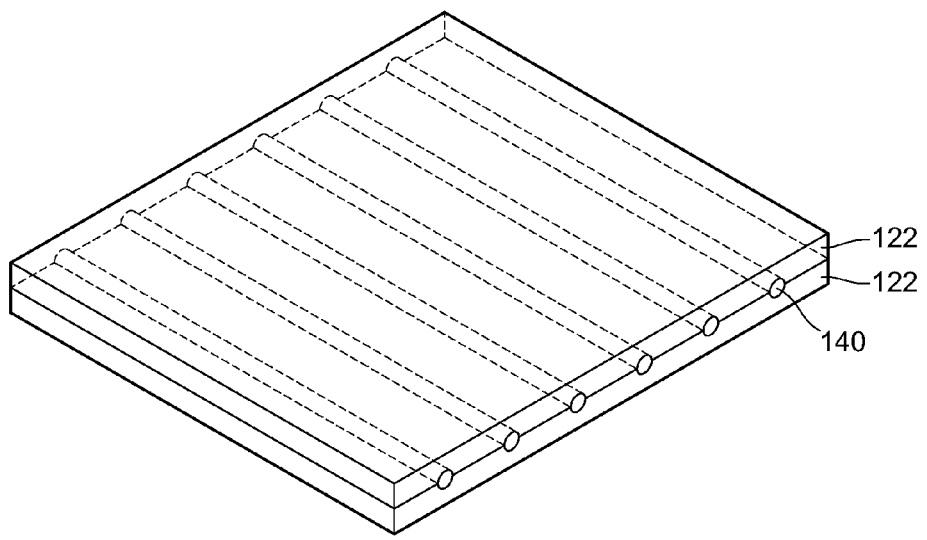
FIG. 8B is a schematic three-dimensional view of thermal and electrical conductive poles sandwiched between two first insulating material layers according to the second embodiment of the present disclosure.
Figure 8C:
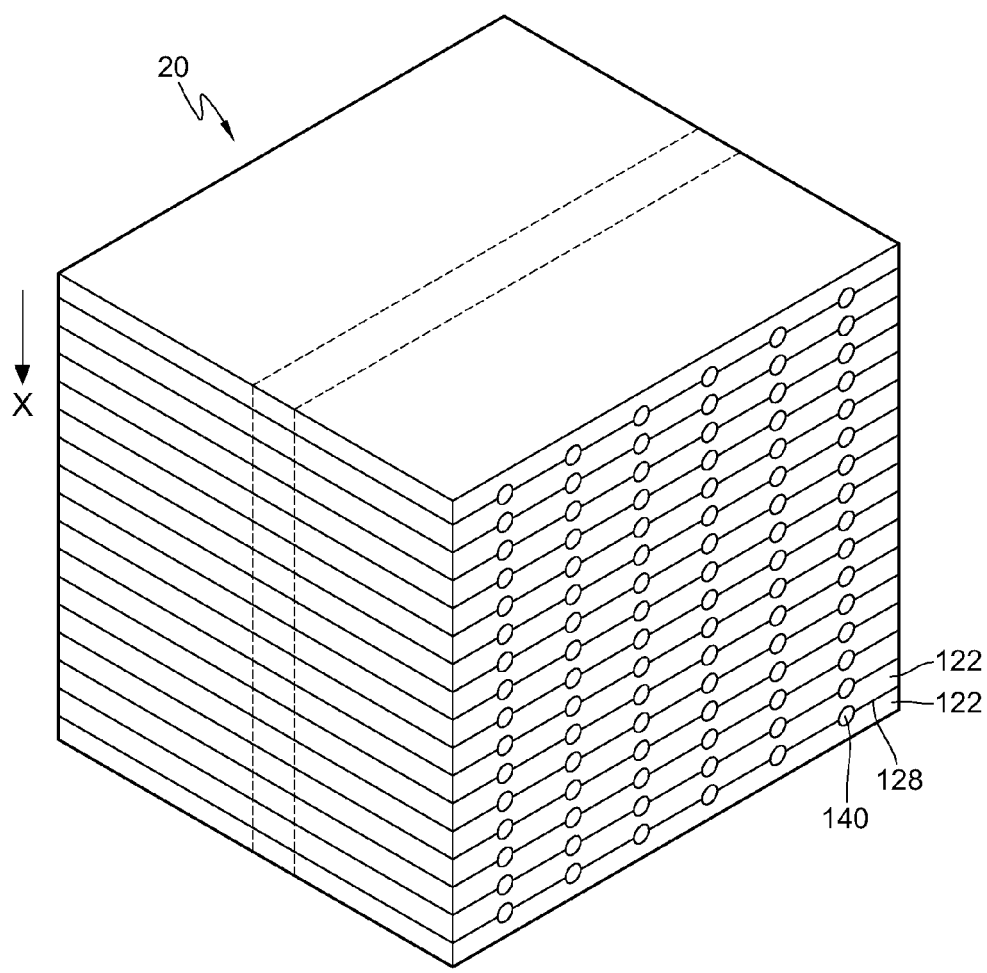
FIG. 8C is a schematic three-dimensional view of a stacked structure according to the second embodiment of the present disclosure.
Figure 8D:
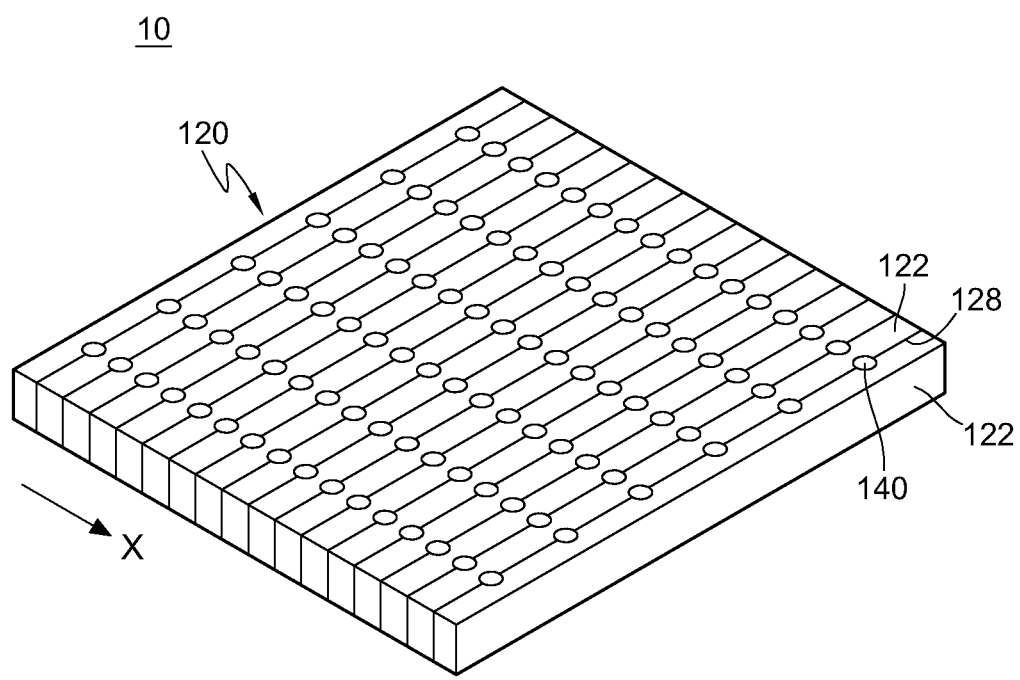
FIG. 8D is a schematic three-dimensional view of the second embodiment of the present disclosure.

FIG. 7 to FIG. 8D illustrate a substrate and a manufacturing method thereof according to a second embodiment of the present disclosure. Referring to the figures, the manufacturing method of the substrate 10 comprises multiple steps. Firstly, a plurality of first insulating material layers 122 and a plurality of thermal and electrical conductive poles 140 are provided (S301). The material of any of the first insulating material layer 122 may be, but not limited to, one selected from a group consisting of ceramic, diamond-like carbon, diamond, mono-crystalline silicon, polycrystalline silicon, glass and any combination thereof, e.g. green low-temperature co-fired ceramic (LTCC) or ceramic slurry. The material of the thermal and electrical conductive pole 140 may be, but not limited to, a linear or columnar object made of graphite or copper, silver, gold, aluminum and any alloy thereof.

Then, the plurality of first insulating material layers 122 and the plurality of thermal and electrical conductive poles 140 are alternately stacked (interlaced) along the stacking direction x, so as to form a sandwich structure 20 (S302), in which a part of the plurality of thermal and electrical conductive poles 140 is arranged at an interval of smaller than 1 mm on a surface of one of the first insulating material layers 122. Moreover, the plurality of thermal and electrical conductive poles 140 may be, but not limited to being, arranged at an interval in parallel to each other, so that the axis of each of the plurality of thermal and electrical conductive poles 140 is substantially perpendicular to the stacking direction x. After that, the rest first insulating material layers 122 and thermal and electrical conductive poles 140 are alternately stacked along the stacking direction x, so that the plurality of thermal and electrical conductive poles 140 is arranged between two adjacent first insulating material layers 124, so as to form the sandwich structure 20 by staggering the plurality of first insulating material layers 122 and the plurality of thermal and electrical conductive poles 140.

Thereafter, the sandwich structure 20 is sintered at a temperature lower than 1000° C. (S303). When the first insulating material layers 122 are heated to reach the sintering temperature, the interface between two adjacent first insulating material layers 122 may form a sintered interface 128 through the phase change, and thus the plurality of first insulating material layers 122 and the plurality of thermal and electrical conductive poles 140 are bonded together.

Finally, the sintered sandwich structure 20 is cut along the radial direction of the plurality of thermal and electrical conductive poles 140 (S304) to obtain a plurality of substrates 10. The plurality of thermal and electrical conductive poles 140 of the substrate 10 are arranged at an interval in each sintered interface 128, and two opposite ends of each thermal and electrical conductive pole 140 are at the same level as the two opposite side surfaces of the body 120, so that the plurality of thermal and electrical conductive poles 140 in the substrate 10 has the conductive characteristics of electrical conduction in the perpendicular direction and non-electrical conduction in the lateral direction. Therefore, when the substrate 10 is used for carrying the electronic elements (not shown) such as the COW or micro-processing wafer which produces high thermal energy during operation, the plurality of thermal and electrical conductive poles 140 is directly in contact with the surface of the electronic elements, and thus the electronic elements may play the heat dissipation and electrical conduction role through the plurality of thermal and electrical conductive poles 140. In addition, the first insulating material layers 122 have low coefficient of thermal expansion, thereby preventing the breaking or the shift between the substrate 10 and the electronic elements caused by the thermal deformation of the substrate 10.

As mentioned above, there is no need for the present manufacturing method to use additional drilling and electrical conductive slurry filling procedures. The manufacturing procedure of the substrate can be simplified. Additionally, since the thermal and electrical conductive poles are utilized the present disclosure instead of a through hole, the diameter of the thermal and electrical conductive poles can be as small as possible (e.g. smaller than 500 μm) without consideration of conductive defect caused by slurry-filled technique. Further, since the thermal and electrical conductive poles are solid columns (or wire material) disposed in the substrate, the electrical conductive and heat dissipation channel formed in the substrate has a dense structure, thereby effectively improving the thermal conductive and electrical conductive performance of the substrate. Furthermore, when the substrate is applied in application of the LED package, based on the characteristics of the thermal and electrical conductive poles distributed in a high density in the substrate, the plurality of COWs may be bonded on the substrate without additionally aligning each COW, so the manufacturing procedure of the die structure is accelerated and the die structure may be put into mass production in batches, thereby improving the capacity and reducing the manufacturing cost.

What is claimed is:

1. A die structure manufacturing method, comprising:
providing a carrier board where a plurality of chip on wafer (COWs) are disposed;
providing a substrate, wherein the substrate has a plurality of thermal and electrical conductive poles, and two ends of each of the plurality of thermal and electrical conductive poles are exposed out of two opposite side surfaces of the substrate;
bonding the plurality of COWs on one of the side surfaces of the substrate to make the plurality of thermal and electrical conductive poles in contact with the plurality of COWs;
removing the carrier board;
adhering a phosphor plate on the plurality of COWs so as to form a stacked structure; and
cutting the stacked structure to form a plurality of die structures.

2. A die structure, comprising:
a substrate, wherein the substrate has a plurality of thermal and electrical conductive poles, and two ends of each of the plurality of thermal and electrical conductive poles are exposed out of two opposite side surfaces of the substrate;
an chip on wafer (COW), disposed on one of the side surfaces of the substrate and in contact with the plurality of thermal and electrical conductive poles; and
a phosphor plate, disposed on one side surface of the COW opposite to the substrate.

3. The die structure according to claim 2, wherein the substrate comprises a body comprising a plurality of first insulating material layers stacked along a stacking direction, the plurality of thermal and electrical conductive poles are arranged at an interval between every two adjacent first insulating material layers, and an axis of each of the plurality of thermal and electrical conductive poles is substantially perpendicular to the stacking direction, wherein two opposite ends of each of the plurality of thermal and electrical conductive poles are exposed out of two opposite side surfaces of the body.

4. The die structure according to claim 3, wherein the body further comprises a plurality of second insulating material layers disposed between every two adjacent first insulating material layers, the plurality of thermal and electrical conductive poles are arranged at an interval in each second insulating material layer.

5. The die structure according to claim 3, wherein a material of the body is one selected from a group consisting of ceramic, diamond-like carbon, diamond, mono-crystalline silicon, polycrystalline silicon, glass and any combination thereof.

6. The die structure according to claim 3, wherein the plurality of thermal and electrical conductive poles are arranged at an interval of 0.02 mm to 1.0 mm.

7. The die structure according to claim 2, wherein the material of the plurality of thermal and electrical conductive poles is one selected from a group consisting of copper, silver, gold, aluminum and any alloy thereof.

8. The die structure according to claim 2, wherein the material of the plurality of thermal and electrical conductive poles is graphite.

9. The die structure according to claim 2, wherein the diameter of each thermal and electrical conductive pole is between 10 μm and 500 μm.

10. A substrate, comprising:
a body, comprising a plurality of first insulating material layers stacked along a stacking direction; and
a plurality of thermal and electrical conductive poles, wherein the diameter of each thermal and electrical conductive pole is between 10 μm and 500 μm, the plurality of thermal and electrical conductive poles are arranged at an interval of 0.02 mm and 1.0 mm between every two adjacent first insulating material layers and an axis of each of the plurality of thermal and electrical conductive poles is substantially perpendicular to the stacking direction, wherein two end of each of the plurality of thermal and electrical conductive poles are exposed out of two opposite surfaces of the body.

11. The substrate according to claim 10, wherein the body further comprises a plurality of second insulating material layers disposed between every two adjacent first insulating material layers, and the plurality of thermal and electrical conductive poles are arranged at an interval in each second insulating material layer.

12. The substrate according to claim 10, wherein the material of the first insulating material layers is one selected from a group consisting of ceramic, diamond-like carbon, diamond, mono-crystalline silicon, polycrystalline silicon, glass and any combination thereof.

13. The substrate according to claim 12, wherein the ceramic is low-temperature co-fired ceramic (LTCC), aluminum oxide ceramic or aluminum nitride ceramic.

14. The substrate according to claim 11, wherein the material of the second insulating material layers is one selected from a group consisting of ceramic, diamond-like carbon, diamond, mono-crystalline silicon, polycrystalline silicon, glass and any combination thereof.

15. The substrate according to claim 14, wherein the ceramic is low-temperature co-fired ceramic (LTCC), aluminum oxide ceramic or aluminum nitride ceramic.

16. The substrate according to claim 10, wherein the material of the plurality of thermal and electrical conductive poles is one selected from a group consisting of copper, silver, gold, aluminum and any alloy thereof.

17. The substrate according to claim 10, wherein the material of the plurality of thermal and electrical conductive poles is graphite.

* * * * *